United States Patent
Miyazawa

(10) Patent No.: US 6,732,907 B2
(45) Date of Patent: May 11, 2004

(54) SOLDERING METHOD, SOLDERING DEVICE, AND METHOD AND DEVICE OF FABRICATING ELECTRONIC CIRCUIT MODULE

(75) Inventor: Ikuya Miyazawa, Suwa (JP)

(73) Assignee: Seiko Epson Corporation, Tokyo (JP)

(*) Notice: Subject to any disclaimer, the term of this patent is extended or adjusted under 35 U.S.C. 154(b) by 63 days.

(21) Appl. No.: 10/090,142

(22) Filed: Mar. 5, 2002

(65) Prior Publication Data

US 2002/0130163 A1 Sep. 19, 2002

(30) Foreign Application Priority Data

Mar. 16, 2001 (JP) ......................................... 2001-075534

(51) Int. Cl.[7] ................... B23K 31/02; B23K 35/12; B23K 1/08
(52) U.S. Cl. ................... 228/180.1; 228/36; 228/37; 228/40; 228/180.21; 228/180.22; 228/260
(58) Field of Search .................. 228/180.21, 180.22, 228/180.1, 37, 36, 260, 40, 51, 125

(56) References Cited

U.S. PATENT DOCUMENTS

| 4,402,448 A | * | 9/1983 | O'Rourke ................... 228/125 |
| 4,477,512 A | * | 10/1984 | Thomas et al. ............. 442/180 |
| 4,573,105 A | * | 2/1986 | Beldavs ....................... 361/768 |
| 4,600,137 A | * | 7/1986 | Comerford ................... 228/102 |
| 4,805,828 A | * | 2/1989 | Witherell et al. ............. 228/46 |
| 5,209,782 A | * | 5/1993 | Morris ........................ 118/603 |
| 5,230,460 A | * | 7/1993 | Deamborsio et al. .... 228/180.1 |
| 5,232,562 A | * | 8/1993 | Elliott .......................... 29/825 |
| 5,356,066 A | | 10/1994 | Yamada |
| 6,164,516 A | * | 12/2000 | Watanabe et al. ............. 228/37 |
| 6,257,480 B1 | * | 7/2001 | Furumoto et al. .......... 228/125 |
| 2002/0182842 A1 | * | 12/2002 | Miyazawa ................... 438/612 |
| 2003/0030149 A1 | * | 2/2003 | Miura et al. ................. 257/772 |
| 2003/0034381 A1 | * | 2/2003 | Nakatsuka et al. ...... 228/180.1 |

FOREIGN PATENT DOCUMENTS

| JP | A 8-116167 | 5/1996 |
| JP | 09-307221 A | * 11/1997 |
| JP | A 2002-204060 | 7/2002 |
| TW | 75100712 | 10/1986 |
| TW | 84103888 | 11/1997 |

OTHER PUBLICATIONS

U.S. patent application Ser. No. 10/079,432, Miyazawa, filed Feb. 22, 2002.

* cited by examiner

*Primary Examiner*—L. Edmondson
(74) *Attorney, Agent, or Firm*—Oliff & Berridge, PLC

(57) ABSTRACT

A soldering method including: bonding a first electronic component having electrodes plated with a material containing lead to one surface of an interconnect substrate through solder containing no lead; and flow-soldering to bond a second electronic component to the other surface of the interconnect substrate. In the soldering method, a joint section between the first electronic component and the interconnect substrate is heated at the same time as or after the step of flow soldering to melt the joint section.

21 Claims, 5 Drawing Sheets

# SOLDERING METHOD, SOLDERING DEVICE, AND METHOD AND DEVICE OF FABRICATING ELECTRONIC CIRCUIT MODULE

Japanese Patent Application No. 2001-075534, filed on Mar. 16, 2001, is hereby incorporated by reference in its entirety.

BACKGROUND OF THE INVENTION

The present invention relates to a soldering method, a soldering device, and a method and a device of fabricating an electronic circuit module.

A method of bonding a plurality of electronic parts to an interconnect substrate by combining reflow soldering and flow soldering is known. In this case, one surface of the interconnect substrate is generally subjected to reflow soldering, and the other surface is subjected to flow soldering thereafter.

In recent years, it is desired that the electronic parts be mounted using solder containing no lead. However, since electrodes of the electronic parts are generally plated with a material containing lead, a metal layer containing lead may segregate in solder joint sections at the boundary with the interconnect substrate after reflow soldering. Since the metal layer containing lead has a melting point lower than that of the metal layer containing no lead, the solder joint sections of the electronic parts mounted on one surface of the interconnect substrate may be removed from the interconnect substrate as a result of heat applied from the other surface during flow soldering.

SUMMARY OF THE INVENTION

According to a first aspect of the present invention, there is provided a soldering method comprising the steps of:
bonding a first electronic component having electrodes plated with a material containing lead to one surface of an interconnect substrate through solder containing no lead;
flow-soldering to bond a second electronic component to the other surface of the interconnect substrate; and
heating a joint section between the first electronic component and the interconnect substrate at the same time as or after the step of flow-soldering to melt the joint section.

According to a second aspect of the present invention, there is provided a method of fabricating an electronic circuit module, wherein the first and second electronic components are mounted on the interconnect substrate by the above soldering method.

According to a third aspect of the present invention, there is provided a soldering device comprising:
a flow soldering section, when a first electronic component having electrodes plated with a material containing lead is bonded to one surface of an interconnect substrate through solder containing no lead, bonds a second electronic component to the other surface of the interconnect substrate,
wherein the flow soldering section includes a heater disposed on the side of a surface of the interconnect substrate to which the first electronic component is bonded, to melt a joint section between the first electronic component and the interconnect substrate.

According to a fourth aspect of the present invention, there is provided a device of fabricating an electronic circuit module comprising the above soldering device, wherein the first and second electronic components are mounted on the interconnect substrate.

DETAILED DESCRIPTION OF THE EMBODIMENTS

Figure 1:
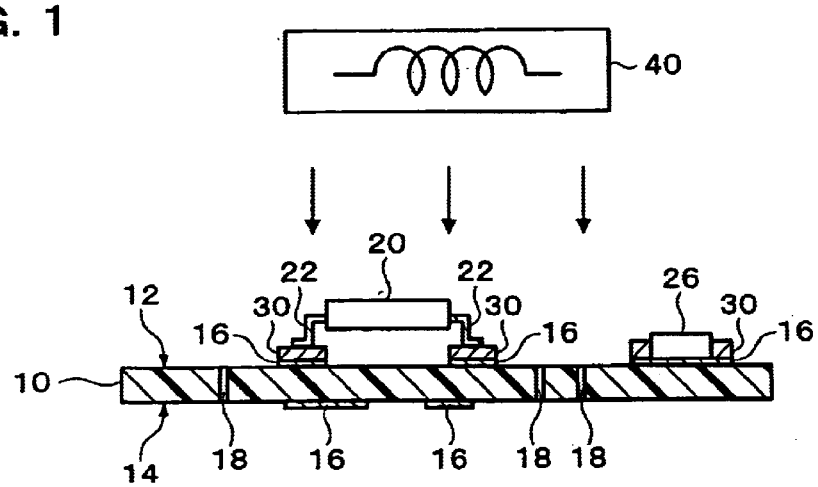
FIG. 1 is a view showing a soldering method according to an embodiment to which the present invention is applied.

An embodiment of the present invention may provide a soldering method, a soldering device, and a method and a device of fabricating an electronic circuit module capable of solving the above-described problem and ensuring a highly reliable electrical connection between electronic parts and an interconnect substrate.

(1) According to an embodiment of the present invention, there is provided a soldering method comprising the steps of:
bonding a first electronic component having electrodes plated with a material containing lead to one surface of an interconnect substrate through solder containing no lead;
flow-soldering to bond a second electronic component to the other surface of the interconnect substrate; and
heating a joint section between the first electronic component and the interconnect substrate at the same time as or after the step of flow-soldering to melt the joint section.

According to this embodiment, the joint section between the first electronic component and the interconnect substrate is heated at the same time as or after the flow soldering step. This causes the entire area of the joint section to remelt. Therefore, a problem in which only a low-melting-point area containing lead in the joint sections is melted due to heat during flow soldering can be prevented. Because of this, the first electronic component can be prevented from being removed from the interconnect substrate.

(2) In this soldering method, the step of heating the joint section may be performed at the same time as the step of flow soldering.

(3) In this soldering method, the step of heating the joint section maybe performed after the step of flow soldering.

This enables the entire area of the joint section to be melted.

(4) In this soldering method, the step of heating the joint section maybe performed both at the same time as and after the step of flow soldering.

(5) In this soldering method, the step of heating the joint section may be performed by at least one of radiant heat and a hot blast.

(6) In this soldering method, the first electronic component may be bonded to one surface of the interconnect substrate by reflow soldering.

According to this feature, flow soldering is performed after bonding the first electronic component to the interconnect substrate using reflow soldering.

(7) In this soldering method, the first electronic component may be bonded to one surface of the interconnect substrate by hand soldering.

(8) This soldering method may further comprise a step of preheating the joint section before the step of flow soldering.

This enables the entire area of the joint section to be melted reliably after the preheating step.

(9) In this soldering method, the solder containing no lead may be formed of at least one material selected from a group consisting of tin, silver, copper, zinc, and bismuth.

(10) In this soldering method, at least the step of heating the joint section may be performed in a chamber.

(11) According to another embodiment of the present invention, there is provided a method of fabricating an electronic circuit module, wherein the first and second electronic components are mounted on the interconnect substrate by the above soldering method.

(12) According to still another embodiment of the present invention, there is provided a soldering device comprising:

a flow soldering section, when a first electronic component having electrodes plated with a material containing lead is bonded to one surface of an interconnect substrate through solder containing no lead, bonds a second electronic component to the other surface of the interconnect substrate, wherein the flow soldering section includes a heater disposed on the side of a surface of the interconnect substrate to which the first electronic component is bonded, to melt a joint section between the first electronic component and the interconnect substrate.

According to this embodiment, the flow soldering device includes the heater disposed on the side of a surface of the interconnect substrate to which the first electronic component is bonded. This enables the entire area of the joint section between the first electronic component and the interconnect substrate to be remelted. Therefore, a problem in which only a low-melting-point area containing lead in the joint section is melted due to heat during flow soldering can be prevented. Because of this, the first electronic component can be prevented from being removed from the interconnect substrate.

(13) In this soldering device, the flow soldering section may have a solder supplying section disposed on the side of the other surface of the interconnect substrate; and the heater may be disposed above the solder supplying section.

This enables the joint section to be heated during the flow soldering.

(14) In this soldering device, the flow soldering section may have a solder supplying section disposed on the side of the other surface of the interconnect substrate; and the heater may be disposed downstream from the solder supplying section in a direction in which the interconnect substrate is transferred.

This enables the entire area of the joint section to be melted.

(15) In this soldering device, the flow soldering section may have a solder supplying section disposed on the side of the other surface of the interconnect substrate; and the heater may be disposed above the solder supplying section or downstream from the solder supplying section in a direction in which the interconnect substrate is transferred.

(16) This soldering device may comprise a plurality of the heaters, wherein the flow soldering section may have a solder supplying section disposed on the side of the other surface of the interconnect substrate;

wherein part of the heaters may be disposed above the solder supplying section; and wherein another part of the heaters may be disposed downstream from the solder supplying section in a direction in which the interconnect substrate is transferred.

(17) This soldering device may have a plurality of the above heaters, wherein at least one of the heaters may be a far infrared heater.

(18) This soldering device may further comprise a fan.

This enables the joint section to be heated efficiently.

(19) This soldering device may further comprise a reflow soldering section for bonding the first electronic component to one surface of the interconnect substrate.

(20) This soldering device may further comprise a second heater for preheating the joint section before flow soldering.

This enables the entire area of the joint section to be melted reliably after the preheating step.

(21) This soldering device may further comprise a chamber in which at least the flow soldering section is disposed.

(22) According to further embodiment of the present invention, there is provided a device of fabricating an electronic circuit module comprising the above soldering device, wherein the first and second electronic components are mounted on the interconnect substrate.

An embodiment of the present invention is described below with reference to the drawings. However, the present invention is not limited to the following embodiment.

FIGS. 1 to 7 are views illustrating a soldering method and a soldering device according to the embodiment to which the present invention is applied. In the embodiment of the present invention, first electronic components 20 and 26 are bonded to a first surface 12 of an interconnect substrate 10, and second electronic components 50, 52, 54, and 56 are then bonded to the interconnect substrate 10 using flow soldering.

Figure 2:
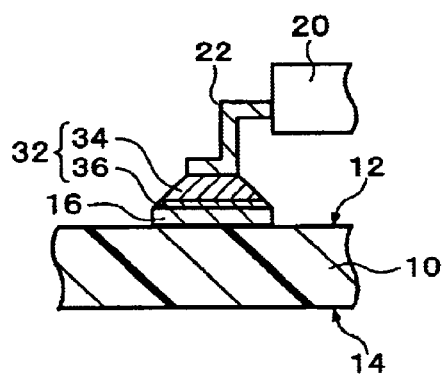
FIG. 2 is a view showing the soldering method according to the embodiment to which the present invention is applied.

FIGS. 1 and 2 are views showing a step of bonding the first electronic components 20 and 26 to the interconnect substrate 10. In the example shown in the figures, the first electronic components 20 and 26 are mounted using reflow soldering.

As the interconnect substrate 10, a conventional interconnect substrate may be used. The interconnect substrate 10 is an organic or inorganic substrate on which interconnect patterns 16 are formed. The interconnect substrate 10 may be referred to as a circuit substrate or a printed wiring board (PWB). The interconnect substrate 10 is provided with various types of electronic parts mounted thereon and installed in electronic equipment. The interconnect substrate 10 may be either a rigid substrate or a flexible substrate, which may be either a single-layer substrate or a multi-layer substrate.

The interconnect substrate 10 has the first surface 12 and a second surface 14 opposite thereto. Through-holes 18 may optionally be formed through the first and second surfaces 12 and 14 of the interconnect substrate 10. Part of the interconnect patterns 16 is formed in the through-holes 18. Leads of through-hole type electronic parts are inserted into the through-holes 18.

Solder 30 is applied to the first surface 12 of the interconnect substrate 10. The solder 30 may be applied to lands of the interconnect patterns 16. The first electronic components 20 and 26 are soldered onto the interconnect patterns 16 using the solder 30. As the solder 30, solder containing no lead (lead-free solder) is used. The material for the solder 30 is not limited insofar as the material does not contain lead. The solder 30 may be formed of a material containing at least one of tin, silver, copper, zinc, and bismuth. As examples of the solder 30, Sn—Ag-based solder, Sn—Ag—Cu-based solder, Sn—Ag—Bi-based solder, Sn—Ag—Cu—Bi-based solder, Sn—Zn-based solder, Sn—Zn—Bi-based solder, and the like can be given. The ratio of the elements in the material for the solder 30 is not limited. For example, the ratio may be Sn(91%)-Zn(9%), Sn(89%)-Zn (8%)-Bi(3%), or Sn(89%)-Zn(8 to 1%)-Bi(3 to 10%). The solder 30 is supplied in an appropriate amount using printing or the like.

The first electronic components 20 and 26 are mounted on the first surface 12 of the interconnect substrate 10 through the solder 30. The first electronic components 20 and 26 are generally surface-mount type electronic parts (SMD). The surface-mount type electronic parts are generally bonded to the interconnect substrate 10 using reflow soldering. The first electronic components 20 and 26 include electronic devices such as an active device or passive device. The first electronic components 20 and 26 may be formed by packaging electronic devices. As examples of the first electronic components 20 and 26, semiconductor devices, resistors, capacitors, coils, oscillators, filters, temperature sensors, thermistors, varistors, variable resistors, fuses, and the like can be given.

The first electronic components 20 and 26 have electrodes (external terminals) which are bonded to the interconnect patterns 16. The electrodes of at least one of the first electronic components 20 and 26 are plated with a material containing lead. For example, the first electronic component 20 has leads (electrodes) 22, of which the surface is plated with a material containing lead. In the example shown in FIG. 1, the first electronic component 20 is a QFP-type semiconductor device.

The first surface 12 on which the first electronic components 20 and 26 are mounted is subjected to a reflow step, as shown in FIG. 1. Specifically, the interconnect substrate 10 is placed in a furnace equipped with a heater 40. The heater 40 is generally disposed on the side of the first surface 12 of the interconnect substrate 10. The reflow step may be performed using a conventional method.

The solder 30 is melted during the reflow step, whereby the first electronic components 20 and 26 are bonded to the interconnect patterns 16 on the first surface 12, as shown in FIG. 2. In more detail, a joint section 32 which electrically connects the first electronic component 20 with the interconnect substrate 10 is formed between the lead 22 and the interconnect pattern 16.

Since the lead 22 is plated with a material containing lead, a metal layer containing lead is partly formed in the joint section 32 after the reflow step. In more detail, a first metal layer 34 containing no lead and a second metal layer 36 containing lead are formed in the joint section 32. The second metal layer 36 is generally formed in the joint section 32 at the boundary with the interconnect pattern 16. In the case of using Sn—Ag—Cu-based solder as the solder 30, the second metal layer 36 is formed of an Sn—Ag—Pb-based metal. The second metal layer 36 containing lead has a melting point lower than that of the first metal layer 34 containing no lead.

According to the embodiment of the present invention, a decrease in the bonding strength of the first electronic component 20 to the interconnect substrate 10 can be prevented by eliminating a problem caused by the formation of the second metal layer 36 having a comparatively lower melting point, as described later.

Differing from the above-described example, the first electronic components 20 and 26 may be bonded to the first surface 12 of the interconnect substrate 10 using hand soldering. Specifically, the first electronic components 20 and 26 may be soldered by hand. The first electronic components 20 and 26 may be soldered using reflow soldering and hand soldering in combination.

Figure 3:
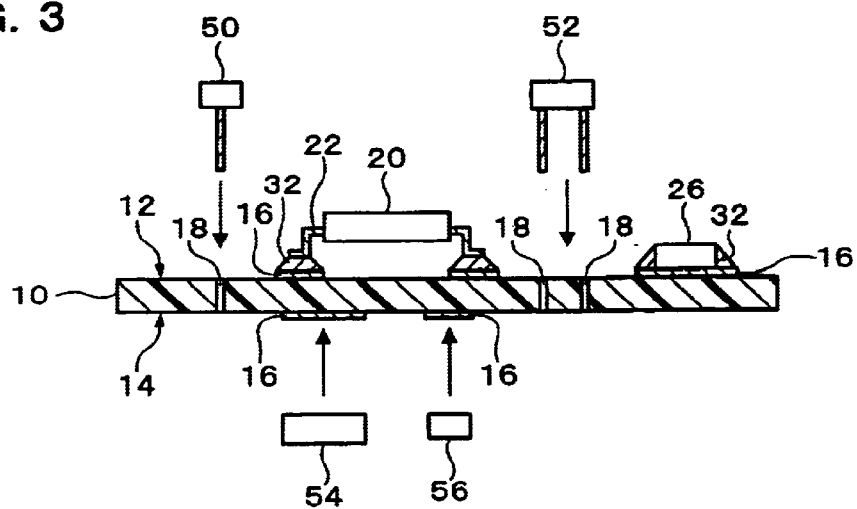
FIG. 3 is a view showing the soldering method according to the embodiment to which the present invention is applied.
Figure 4:
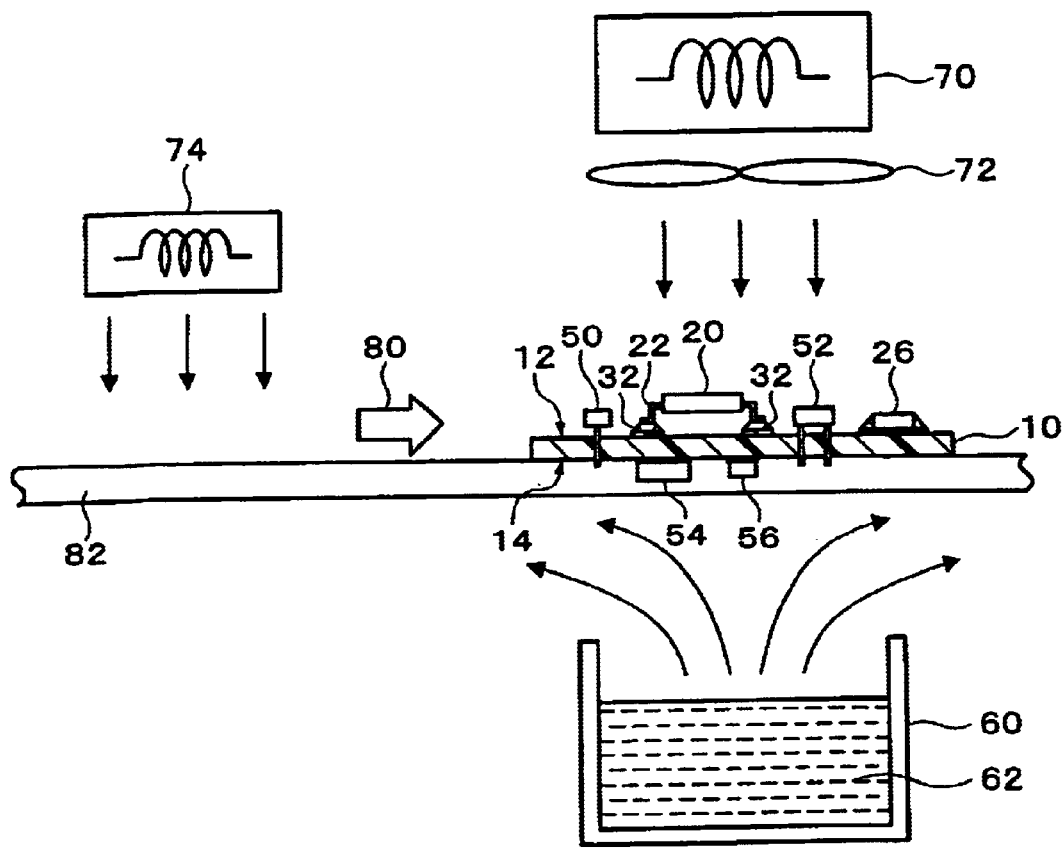
FIG. 4 is a view showing the soldering method and a soldering device according to the embodiment to which the present invention is applied.

FIGS. 3 and 4 are views showing a step of bonding the second electronic components 50, 52, 54 and 56 to the interconnect substrate 10 using flow soldering. The second surface 14 of the interconnect substrate 10 is subjected to flow soldering. The second electronic components 50, 52, 54 and 56 may be mounted on either the first surface 12 or the second surface 14 of the interconnect substrate 10.

The second electronic components 50, 52, 54 and 56 are mounted on the interconnect substrate 10, as shown in FIG. 3. The second electronic components 50, 52, 54 and 56 may be either surface-mount types or through-hole types. The through-hole type second electronic components (THD) 50 and 52 are mounted on the first surface 12 of the interconnect substrate 10. The surface-mount type second electronic components (SMD) 54 and 56 are mounted on the second surface 14 of the interconnect substrate 10. The through-hole type second electronic components 50 and 52 are secured by inserting their leads into the through-holes 18. The surface-mount type second electronic components 54 and 56 are bonded to the second surface 14 using an adhesive (not shown). The second electronic components 50 and 52 may be provided after bonding the second electronic components 54 and 56 to the interconnect substrate 10.

The second electronic components 50, 52, 54 and 56 are bonded to the interconnect substrate 10 by flow soldering, as shown in FIG. 4. A flow soldering section is described below. The flow soldering section of this embodiment includes a solder tank (solder supplying section) 60 and a heater 70 disposed on the side of the first surface 12. The soldering device of this embodiment includes the flow soldering section.

The solder tank 60 is disposed on the side of the second surface 14 of the interconnect substrate 10, and supplies molten solder 62. The solder tank 60 may be either a stationary type or jet flow type. Specifically, the flow soldering may be either dip soldering or jet flow soldering. In the case of using jet flow soldering, the molten solder 62 in the solder tank 60 is pressurized using a pump (not shown) and jetted toward the interconnect substrate 10 according to the shape of a nozzle (not shown). In this case, the second surface 14 of the interconnect substrate 10 is heated. The molten solder 62 may be either solder containing lead or solder containing no lead (lead-free solder). The molten solder 62 may be supplied using a conventional method.

The first surface 12 of the interconnect substrate 10 is also heated as a result of heat applied to the second surface 14 during flow soldering. The joint sections 32 on the first surface 12 consist of the first metal layer (containing no lead) 34 and the second metal layer (containing lead) 36 having a melting point lower than that of the first metal layer 34. Therefore, a phenomenon may occur in which the second metal layer 36 is melted when the first surface 12 is heated, but the first metal layer 34 does not melt. This causes the joint sections 32 to be partly melted, whereby the first electronic components 20 and 26 may be removed from the interconnect substrate 10 even if the joint sections 32 are solidified. Therefore, in the embodiment of the present invention, the joint sections 32 are heated using the heater 70 in order to prevent this problem.

The heater 70 is disposed on the side of the first surface 12 of the interconnect substrate 10, as shown in FIG. 4. The number of heaters 70 may be one or more. The heater 70 causes the solder joint sections 32 on the first surface 12 to melt. In more detail, the first metal layer (containing no lead) 34 in the joint sections 32 having a melting point higher than that of the second metal layer (containing lead) 36 is also melted. The temperature of the joint sections 32 heated using the heater 70 may be about 180 to 230° C., for example. In more detail, the temperature of the joint sections 32 heated using the heater 70 reaches or exceeds the temperature at which the first metal layer 34 is melted. For example, in the case where the first metal layer 34 is formed of an Sn—Ag—Cu-based metal, the temperature may be about 217 to 221° C.

The heater 70 may be disposed above the solder tank 60, as shown in FIG. 4. Specifically, the joint sections 32 on the first surface 12 of the interconnect substrate 10 may be heated while performing flow soldering on the second surface 14. Heating using the heater is preferably performed at least at the same time with flow soldering. This causes the entire area of the joint section 32 to be melted efficiently by heat from the heater (heater 70, for example) in addition to heat during flow soldering.

Figure 5:
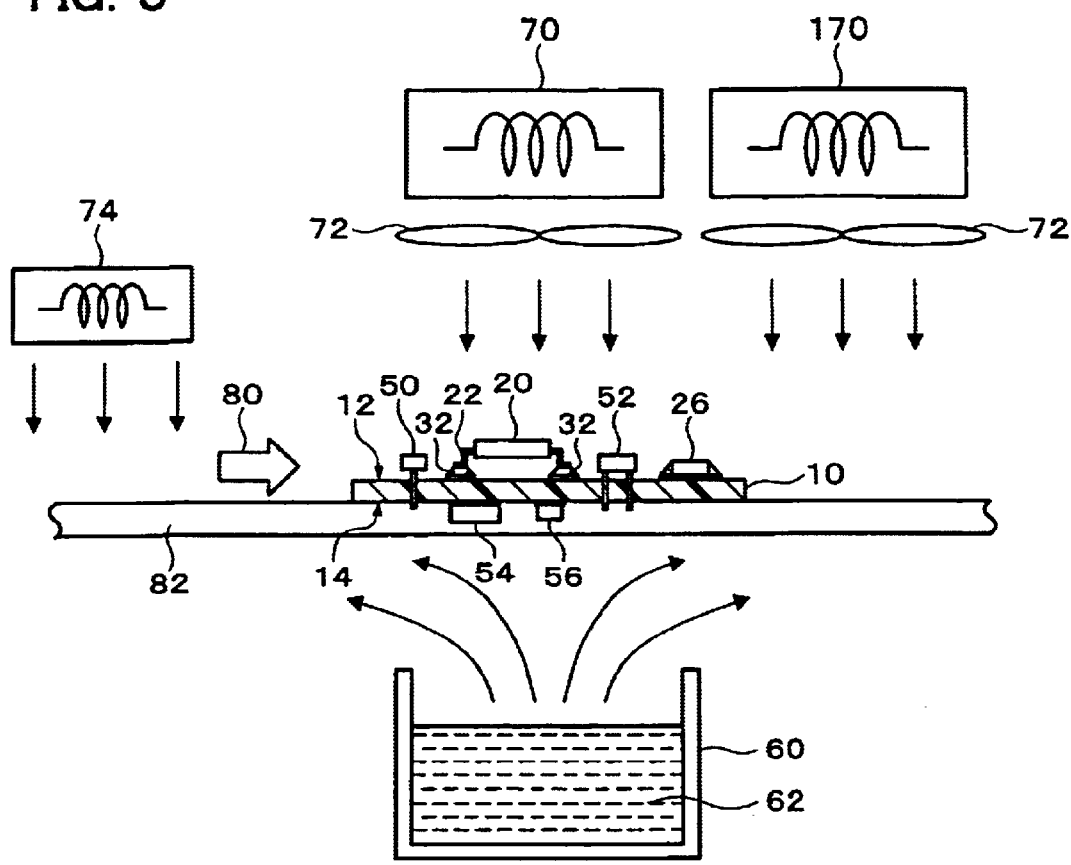
FIG. 5 is a view showing the soldering method and the soldering device according to the embodiment to which the present invention is applied.

A plurality of heaters 70 and 170 may be disposed above the solder tank 60 and downstream therefrom in a direction 80 in which the interconnect substrate 10 is transferred, as shown in FIG. 5. In other words, the heater 70 may be disposed above the solder tank 60, and the heater 170 maybe disposed downstream from the solder tank 60 in the direction 80 in which the interconnect substrate 10 is transferred. According to this feature, since the joint sections 32 are also heated after the completion of flow soldering, the first metal layer 34 which could not be melted during flow soldering can be melted thereafter. Therefore, since the entire area of the joint sections 32 is melted, the joint sections 32 can be solidified by surface tension in a good state. Differing from the example shown in the figure, only one heater (either the heater 70 or heater 170, for example) may be disposed above the solder tank 60 or downstream therefrom.

Figure 6:
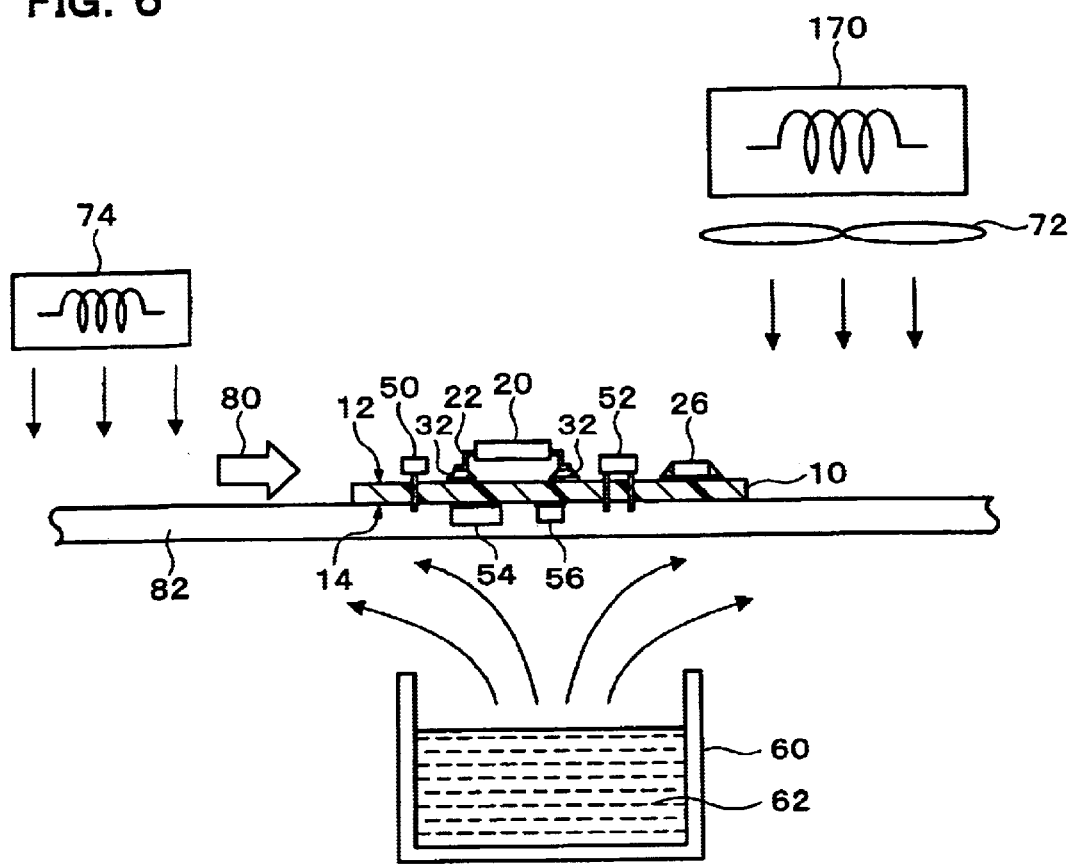
FIG. 6 is a view showing the soldering method and the soldering device according to the embodiment to which the present invention is applied.

The joint sections 32 may be heated using the heater 170 immediately after the completion of flow soldering, as shown in FIG. 6. Specifically, the heater 170 may be disposed downstream from the solder tank 60 in the direction 80 in which the interconnect substrate 10 is transferred. In this case, the entire area of the joint sections 32 can also be melted.

The heating structure of the heaters 70 and 170 is not limited. For example, the heaters 70 and 170 may be infrared heaters (including far infrared heaters). There are no specific limitations to the structure of the infrared heaters insofar as the infrared heaters heat by utilizing infrared radiation (including far infrared radiation). The heaters 70 and 170 may be sheath heaters or coil heaters. In the case of using a plurality of heaters 70 and 170, heaters having different structures may be used in combination. The heating method may be a method using radiant heat of far infrared radiation or the like, a method using a hot blast, a combination of these, or the like. In the case of heating using a hot blast, a hot blast may be applied to the interconnect substrate 10 using a fan 72. This enables the joint sections 32 to be heated efficiently.

A second heater 74 for heating the joint sections 32 on the first surface 12 before performing flow soldering may optionally be provided. The second heater 74 is disposed upstream from the solder tank 60, opposite to the direction 80 in which the interconnect substrate 10 is transferred. The second heater 74 is preferably disposed on the side of the first surface 12 of the interconnect substrate 10. Since the joint sections 32 can be preheated by providing the second heater 74, the joint sections 32 can be melted reliably after preheating. The heating structure and the heating method of the second heater 74 are not limited. Any of those applied to the heater 70 may be applied. The interconnect substrate 10 may be transferred automatically using a transfer means 82.

Figure 7:
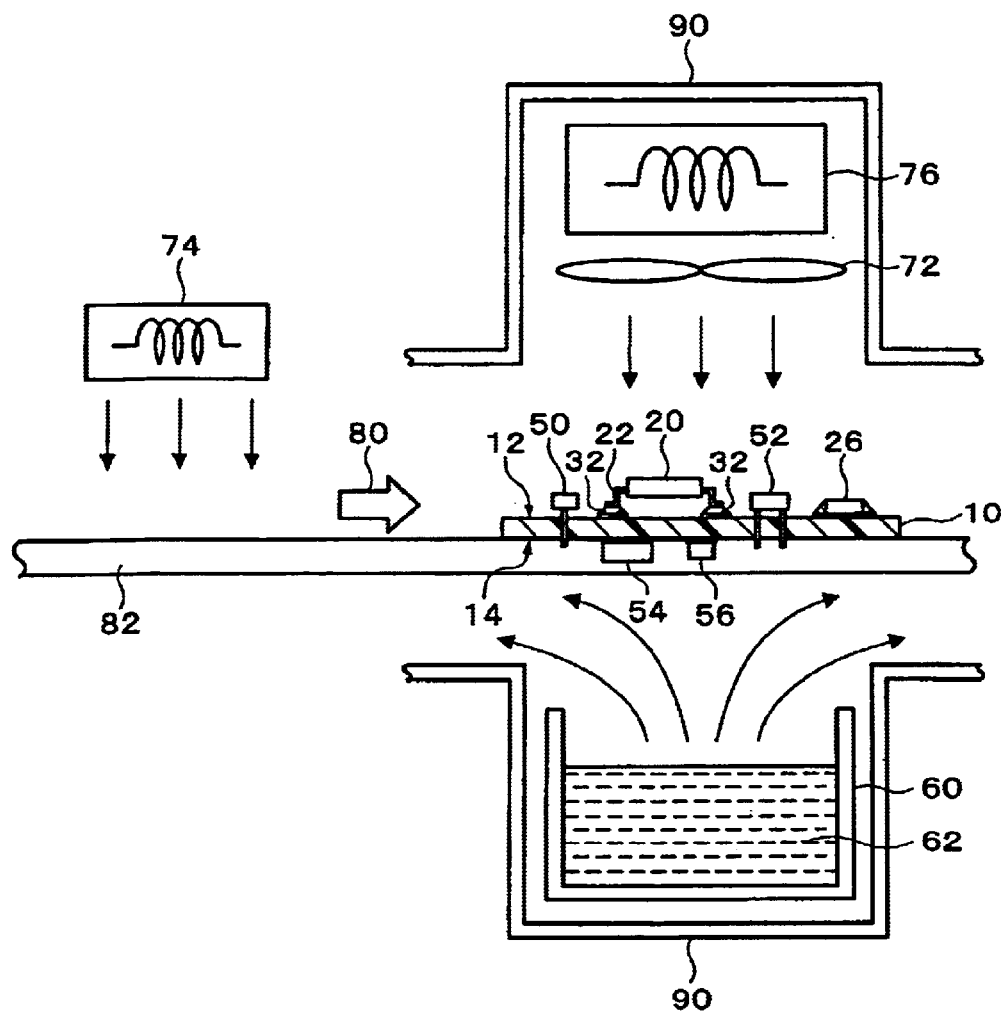
FIG. 7 is a view showing the soldering method and the soldering device according to the embodiment to which the present invention is applied.

The soldering device may include a chamber 90, as shown in FIG. 7. The chamber 90 may be provided in the area of the flow soldering section, as shown in the figure. The chamber 90 may be provided only in the area of the second heater 74, or the chamber 90 may be provided in the area including both the flow soldering section and the second heater 74.

The soldering device according to the embodiment of the present invention may further include a reflow soldering section (not shown). The reflow soldering section is disposed upstream of the transfer means 82.

In this embodiment, flow soldering may be performed using the above flow soldering section. Flux may be applied to the interconnect substrate 10 before applying the molten solder 62. This increases wettability of the solder, whereby the molten solder 62 can be supplied in a good state.

The joint sections 32 on the first surface 12 may optionally be heated before applying the molten solder 62. For example, the joint sections 32 may be heated using the heater 74. The interconnect substrate 10 is then transferred, and the molten solder 62 is supplied to the second surface 14. The joint sections 32 on the first surface 12 are heated after the step of supplying the molten solder 62. For example, the joint sections 32 may be heated using the heater 70. The step of heating the joint sections 32 may be performed either at the same time as or after the flow soldering. This step may be performed both at the same time as and after the flow soldering In the case of heating the joint sections 32 both at the same time as and after the flow soldering, the joint section 32 is heated continuously. The entire area of the joint sections 32 can be remelted by these steps. Specifically, the first metal layer 34 in the junction sections 32 having a melting point higher than that of the second metal layer 36 is also melted. According to this feature, since the entire area of the joint sections 32 is melted, the joint sections 32 are solidified again by surface tension in a good state. Therefore, a decrease in the strength of bonding the first electronic components 20 and 26 to the interconnect substrate 10 can be prevented after the completion of flow soldering.

According to the soldering method of the embodiment of the present invention, the joint sections 32 between the first electronic components 20 and 26 and the interconnect substrate 10 are heated after the step of flow soldering. This causes the entire area of the joint sections 32 to be remelted. Therefore, a problem in which only the low-melting-point area containing lead (second metal layer 36) in the joint sections 32 of the first electronic component 20 is melted by heat during flow soldering can be prevented. Because of this, removal of the first electronic components 20 and 26 from the interconnect substrate 10 can be prevented.

An electronic circuit module may be formed by mounting semiconductor devices or other electronic parts on the interconnect substrate 10 using the above-described method.

Specifically, the above-described content may be applied to a method and a device of fabricating an electronic circuit module. In such cases, the above effects can also be achieved.

What is claimed is:

1. A soldering method comprising the steps of:
   bonding a first electronic component having electrodes plated with a material containing lead to one surface of an interconnect substrate through solder containing no lead;
   flow-soldering to bond a second electronic component to the other surface of the interconnect substrate; and
   heating a joint section between the first electronic component and the interconnect substrate at the same time as or after the step of flow-soldering to melt the joint section.

2. The soldering method as defined in claim 1, wherein the step of heating the joint section is performed at the same time as the step of flow soldering.

3. The soldering method as defined in claim 1, wherein the step of heating the joint section is performed after the step of flow soldering.

4. The soldering method as defined in claim 1, wherein the step of heating the joint section is performed both at the same time as and after the step of flow soldering.

5. The soldering method as defined in claim 1, wherein the step of heating the joint section is performed by at least one of radiant heat and a hot blast.

6. The soldering method as defined in claim 1, wherein the first electronic component is bonded to one surface of the interconnect substrate by reflow soldering.

7. The soldering method as defined in claim 1, wherein the first electronic component is bonded to one surface of the interconnect substrate by hand soldering.

8. The soldering method as defined in claim 1, further comprising:
   a step of preheating the joint section before the step of flow soldering.

9. The soldering method as defined in claim 1, wherein the solder containing no lead is formed of at least one material selected from a group consisting of tin, silver, copper, zinc, and bismuth.

10. The soldering method as defined in claim 1, wherein at least the step of heating the joint section is performed in a chamber.

11. A method of fabricating an electronic circuit module, wherein the first and second electronic components are mounted on the interconnect substrate by the soldering method as defined in claim 1.

12. A soldering device comprising:
    a flow soldering section for bonding a second electronic component to an interconnect substrate to which a first electronic component having electrodes plated with a material containing lead is bonded, the first electronic component being bonded to one surface of an interconnect substrate through solder containing no lead, the second electronic component being bonded to the other surface of the interconnect substrate;
    wherein the flow soldering section includes a heater disposed on the side of the one surface of the interconnect substrate;
    wherein the flow soldering section has a solder supplying section disposed on the side of the other surface of the interconnect substrate; and
    wherein the heater is disposed right above the solder supplying section such that the heater melts a joint section between the first electronic component and the interconnect substrate at the same time that the second electronic component is bonded to the interconnect substrate.

13. A soldering device comprising:
    a flow soldering section for bonding a second electronic component to an interconnect substrate to which a first electronic component having electrodes plated with a material containing lead is bonded, the first electronic component being bonded to one surface of an interconnect substrate through solder containing no lead, the second electronic component being bonded to the other surface of the interconnect substrate;
    wherein the flow soldering section includes a heater disposed on the side of the one surface of the interconnect substrate;
    wherein the flow soldering section has a solder supplying section disposed on the side of the other surface of the interconnect substrate; and
    wherein the heater is disposed downstream from the solder supplying section in a direction in which the interconnect substrate is transferred such that the heater melts a joint section between the first electronic component and the interconnect substrate after the second electronic component is bonded to the interconnect substrate.

14. A soldering device comprising:
    a flow soldering section for bonding a second electronic component to an interconnect substrate to which a first electronic component having electrodes plated with a material containing lead is bonded, the first electronic component being bonded to one surface of an interconnect substrate through solder containing no lead, the second electronic component being bonded to the other surface of the interconnect substrate;
    wherein the flow soldering section includes a heater disposed on the side of the one surface of the interconnect substrate;
    wherein the flow soldering section has a solder supplying section disposed on the side of the other surface of the interconnect substrate; and
    wherein the heater is disposed right above the solder supplying section and downstream from the solder supplying section in a direction in which the interconnect substrate is transferred such that the heater melts a joint section between the first electronic component and the interconnect substrate at the same time or after the second electronic component is bonded to the interconnect substrate.

15. A soldering device comprising:
    a flow soldering section for bonding a second electronic component to an interconnect substrate to which a first electronic component having electrodes plated with a material containing lead is bonded, the first electronic component being bonded to one surface of an interconnect substrate through solder containing no lead, the second electronic component being bonded to the other surface of the interconnect substrate;
    wherein the flow soldering section includes a plurality of the heaters disposed on the side of the one surface of the interconnect substrate;
    wherein the flow soldering section has a solder supplying section disposed on the side of the other surface of the interconnect substrate;

wherein part of the heaters is disposed right above the solder supplying section, and wherein another part of the heaters is disposed downstream from the solder supplying section in a direction in which the interconnect substrate is transferred such that the heaters melt a joint section between the first electronic component and the interconnect substrate at the same time or after the second electronic component is bonded to the interconnect substrate.

16. The soldering device as defined in claim 12, comprising:

a plurality of the heaters, wherein at least one of the heaters is a far infrared heater.

17. The soldering device as defined in claim 12, further comprising a fan.

18. The soldering device as defined in claim 12, further comprising:

a reflow soldering section for bonding the first electronic component to one surface of the interconnect substrate.

19. The soldering device as defined in claim 12, further comprising:

a second heater for preheating the joint section before flow soldering.

20. The soldering device as defined in claim 12, further comprising:

a chamber in which at least the flow soldering section is disposed.

21. A device of fabricating an electronic circuit module comprising the soldering device as defined in claim 12, wherein the first and second electronic components are mounted on the interconnect substrate.

* * * * *